United States Patent
Scholz et al.

(10) Patent No.: US 11,316,068 B2
(45) Date of Patent: Apr. 26, 2022

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Dominik Scholz, Bad Abbach (DE); Alexander F. Pfeuffer, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/316,973

(22) PCT Filed: Jul. 12, 2017

(86) PCT No.: PCT/EP2017/067605
§ 371 (c)(1),
(2) Date: Jan. 10, 2019

(87) PCT Pub. No.: WO2018/011298
PCT Pub. Date: Jan. 18, 2018

(65) Prior Publication Data
US 2019/0252577 A1    Aug. 15, 2019

(30) Foreign Application Priority Data
Jul. 13, 2016   (DE) .................. 102016112857.0

(51) Int. Cl.
*H01L 33/08*     (2010.01)
*H01L 27/15*     (2006.01)
(Continued)

(52) U.S. Cl.
CPC ............ *H01L 33/08* (2013.01); *H01L 27/156* (2013.01); *H01L 33/382* (2013.01); *H01L 33/387* (2013.01); *H01L 33/62* (2013.01)

(58) Field of Classification Search
CPC ..... H01L 33/08; H01L 27/156; H01L 25/167; H01L 33/387; H01L 33/62;
(Continued)

(56) References Cited

U.S. PATENT DOCUMENTS 4,845,405 A  *  7/1989  Yamane .................... G09F 9/33
                                                            313/500
8,535,961 B1 *  9/2013  Kuo ....................... H01L 33/486
                                                            438/28
(Continued)

FOREIGN PATENT DOCUMENTS

CN          102832331 A     12/2012
DE       102012112302 A1     6/2014
(Continued)

OTHER PUBLICATIONS

Wikipedia, "Integrated Circuit," Integrated Circuit—Wikipedia, https://en.wikipedia.org/wiki/Integrated_circuit, Apr. 17, 2020, pp. 1-21.
(Continued)

*Primary Examiner* — John A Bodnar
(74) *Attorney, Agent, or Firm* — Slater Matsil, LLP

(57) ABSTRACT

An optoelectronic semiconductor chip and a method for producing an optoelectronic semiconductor chip are disclosed. In an embodiment, a chip includes a semiconductor body comprising a plurality of emission regions, first and second contact points, a rewiring structure and first and second connection points, wherein each emission region is contacted via the first and second contact points and configured to be operated separately from one another, wherein the rewiring structure electrically conductively connects
(Continued)

each first contact point to an associated first connection point, wherein the rewiring structure electrically conductively connects every second contact point to an associated second connection point, wherein at least one of the connection points does not overlap with a contact point which is electrically conductively connected to this connection point in a vertical direction, and wherein each first connection point is disposed laterally directly adjacent to a further first connection point.

3 Claims, 3 Drawing Sheets

(51) Int. Cl.
*H01L 33/62* (2010.01)
*H01L 33/38* (2010.01)

(58) Field of Classification Search
CPC ........... H01L 2224/73265; H01L 24/20; H01L 24/09; H01L 33/382
See application file for complete search history.

(56) References Cited

U.S. PATENT DOCUMENTS

| | | |
|---|---|---|
| 9,899,418 B2 | 2/2018 | Pfeuffer et al. |
| 9,978,703 B2 | 5/2018 | Jakob et al. |
| 2006/0186531 A1 | 8/2006 | Hsu |
| 2010/0214200 A1* | 8/2010 | Suzuki .................... H01L 33/62 345/82 |
| 2013/0056880 A1 | 3/2013 | Wang et al. |
| 2013/0153856 A1* | 6/2013 | Das ..................... H01L 25/0753 257/13 |
| 2013/0193459 A1* | 8/2013 | Kuroki .................... H01L 33/56 257/88 |
| 2015/0279903 A1 | 10/2015 | Mandl et al. |
| 2015/0318444 A1 | 11/2015 | Huang et al. |

FOREIGN PATENT DOCUMENTS

| | | |
|---|---|---|
| DE | 102016100351 A1 | 7/2017 |
| JP | 2004363279 A | 12/2004 |
| KR | 1020140136616 A | 12/2014 |
| WO | 2011101170 A1 | 8/2011 |

OTHER PUBLICATIONS

Wikipedia, "Simply Connected Space," Simply Connected Space—Wikipedia, https://en.wikipedia.org/wiki/Simply_connected_space, Apr. 10, 2020. pp. 1-4.

* cited by examiner

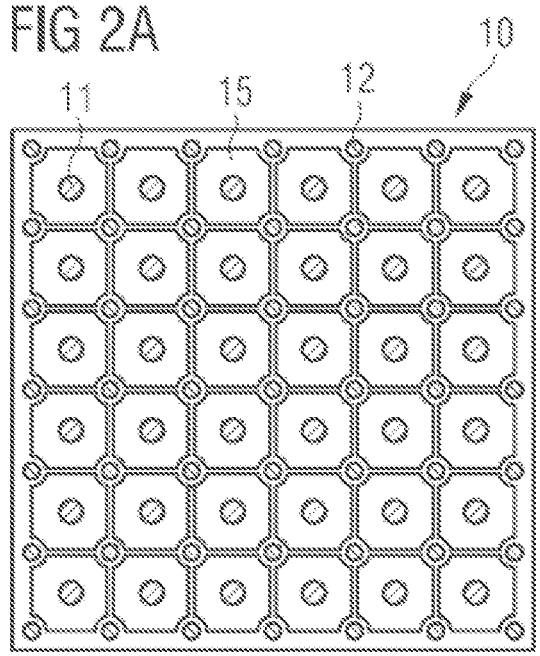
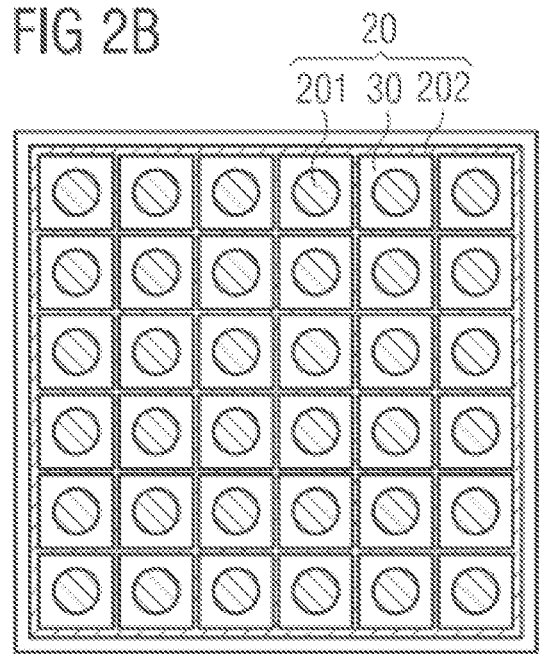
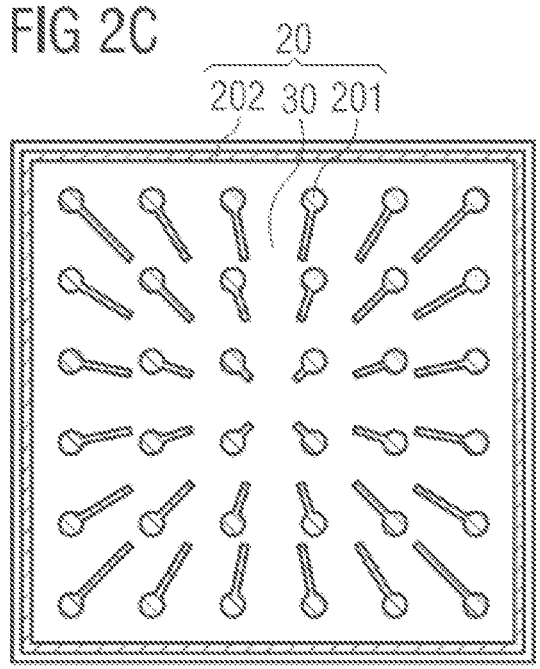
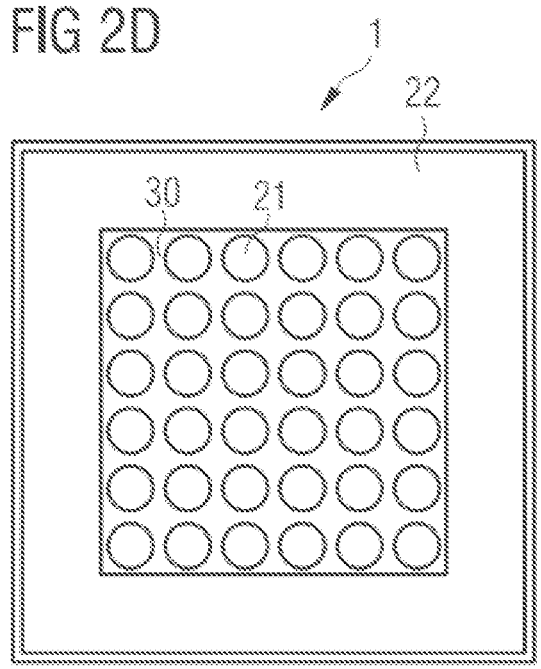

OPTOELECTRONIC SEMICONDUCTOR CHIP AND METHOD FOR PRODUCING AN OPTOELECTRONIC SEMICONDUCTOR CHIP

This patent application is a national phase filing under section 371 of PCT/EP2017/067605, filed Jul. 12, 2017, which claims the priority of German patent application 102016112857.0, filed Jul. 13, 2016, each of which is incorporated herein by reference in its entirety.

TECHNICAL FIELD

An optoelectronic semiconductor chip is specified. In addition, a method for producing an optoelectronic semiconductor chip is specified.

SUMMARY OF THE INVENTION

Embodiments provide an optoelectronic semiconductor chip which can be electrically contacted in a simplified manner. Further embodiments provide a method of producing such an optoelectronic semiconductor chip.

The optoelectronic semiconductor chip, for example, is a radiation-emitting optoelectronic semiconductor chip. The semiconductor chip can, for example, be a light emitting diode chip which is designed to generate electromagnetic radiation, especially light, during normal operation. It is possible that the optoelectronic semiconductor chip generates light in the spectral range from UV radiation to infrared radiation. The optoelectronic semiconductor chip, for example, is a surface-mountable component. In particular, the optoelectronic semiconductor chip is only electrically contacted and operated on one side.

According to at least one embodiment, the optoelectronic semiconductor chip comprises a semiconductor body, first and second contact points, a rewiring structure and first and second connection points.

The semiconductor body is formed, for example, with a semiconductor compound material, for example, a III-V semiconductor compound material, and is designed to generate electromagnetic radiation during normal operation. The semiconductor body comprises a semiconductor of first type, a semiconductor of second type and an active region, which is arranged between the semiconductor of first type and second type. In the normal operation of the optoelectronic semiconductor chip, electromagnetic radiation is generated in the active region. For example, the semiconductor of first type is formed with a p-conducting material and the semiconductor of second type is formed with an n-conducting material. Alternatively, the semiconductor of first type is formed with an n-conducting material and the semiconductor of second type is formed with a p-conducting material.

The semiconductor body is electrically conductively connected to the first and second contact points. The semiconductor body can be electrically contacted and supplied with current via the first and second contact points. In particular, when the optoelectronic semiconductor chip is operated as intended, the first contact points are at a different electrical potential than the second contact points. The contact points can be formed by one or more metals which are applied to the semiconductor body and are in direct contact with it. In particular, the contact points are arranged in a common lateral plane, with the lateral plane extending parallel to the main plane of the semiconductor body. For example, a region of the semiconductor body is removed to produce the second contact points. In order to make the semiconductor of first type freely accessible from the side facing away from the semiconductor of first type, a part of the semiconductor of second type is removed. A second contact point is formed in this region with electrically conductive material, so that the semiconductor of first type can be electrically contacted from the side facing away from semiconductor of first type. The second contact point is formed on the side of the semiconductor of second type facing away from the semiconductor of first type. For this purpose, electrically conductive material is arranged on the semiconductor of second type. In particular, the electrically conductive material of the first and second contact points is arranged in such a way that the surfaces of the first and second contact points facing away from the semiconductor body lie in one plane. For example, the optoelectronic semiconductor chip comprises a plurality of first and/or second contact points arranged at the lattice points of a regular lattice on a main side of the semiconductor body. For example, the first and second contact points are applied to the semiconductor body by physical vapor deposition (PVD), chemical vapor deposition (CVD), evaporation or sputtering.

The rewiring structure is arranged on the side of the semiconductor body on which the first and second contact points are arranged. For example, the contact points are located between the semiconductor body and the rewiring structure. The rewiring structure comprises an electrically conductive rewiring of first type, an electrically conductive rewiring of second type and electrically insulating material. The rewirings of first type and second type are made of an electrically conductive material, such as one or more metals. The electrically insulating material is formed, for example, by a ceramic material such as silicon oxide or silicon nitride or a polymer. For example, when the optoelectronic semiconductor chip is operated as intended, the rewiring of first type has a different electrical potential than the rewiring of second type. The rewirings of first and second type may have a three-dimensional shape. For example, the rewirings of first and second type are constructed in several layers, some of which are arranged overlapping and electrically connected to each other. The rewiring structure can, for example, be produced using a lithography process.

The rewirings of first and second type are embedded in the electrically insulating material. For example, the insulating material is in direct contact with the rewirings of first and second type. In particular, the insulating material covers all surfaces rewirings of first and second type that are not in direct contact with a contact point or a connection point.

The first and second connection points are arranged on the side of the rewiring structure facing away from the semiconductor body. For example, the optoelectronic semiconductor chip comprises a large number of first and second connection points. In particular, the optoelectronic semiconductor chip comprises exactly one second connection point and a plurality of first connection points. The first and second connection points can be arranged in a common plane on the rewiring structure. The first and second connection points are composed of electrically conductive material, such as one or more metals.

Every first connection point is in direct contact with a rewiring of first type and is electrically connected to it. Every second connection point is in direct contact with a rewiring of second type and is electrically conductively connected to it. The connection points can be freely accessible from the outside. In particular, the first and second connection points are set up to be contacted individually in an electrically conductive manner, for example, by means of a solder connection. In particular, the optoelectronic semiconductor chip is electrically contacted and operated via the connection points. For example, when the optoelectronic semiconductor chip is operated as intended, the first connection points are at a different electrical potential than the second connection points.

In particular, first contact points, first connection points and/or rewiring of first type electrically conductively connected to each other are on the same electrical potential. Furthermore, second contact points, second connection points and/or rewirings of second type which are electrically conductively connected to each other can be on the same electrical potential.

According to at least one embodiment, the semiconductor body has a multiplicity of emission regions which are arranged next to one another in the lateral plane. The emission regions are electrically conductively contacted via the first and second contact points and are operated separately from one another. The emission regions are part of the common semiconductor body. For example, the individual emission regions are produced in a common epitaxy process. In order to electrically contact and operate the emission regions separately, for example, an emission region is uniquely assigned to each first contact point. Each second contact point can each be assigned a plurality of emission regions.

According to at least one embodiment of the optoelectronic semiconductor chip, the rewiring structure electrically conductively connects each first contact point to an associated first connection point. The first and second contact points are arranged on the side of the rewiring structure which faces the semiconductor body. The first and second connection points are arranged on the side of the rewiring structure facing away from the semiconductor body. Each first contact point is electrically conductively connected to a first connection point by means of a rewiring of first type. The individual rewirings of first type are electrically insulated from one another by means of the insulating material of the rewiring structure. Furthermore, the individual first connection points and the individual first contact points can be electrically insulated from one another by means of the insulating material.

According to at least one embodiment of the optoelectronic semiconductor chip, the rewiring structure electrically conductively connects each second contact point to an associated second connection point. Each second contact point is electrically conductively connected to a second connection point by means of a rewiring of second type. The individual second connection points can be electrically insulated from one another by means of the insulating material and the individual second contact points can be electrically insulated from one another by means of the insulating material. The insulating material also isolates rewirings of first type electrically from rewirings of second type. Furthermore, first contact points of second contact points and first connection points of second connection points are electrically insulated from one another by means of the insulating material.

According to at least one embodiment of the optoelectronic semiconductor chip, at least one of the connection points does not overlap in the vertical direction with a contact point which is electrically conductively connected to this connection point. The vertical direction is the direction which is perpendicular to the main extension plane of the optoelectronic semiconductor chip. Arranged in a non-overlapping manner means in this context, in such a way that the connection point cannot be imaged by projection in the vertical direction onto the contact point which is electrically conductively connected to the respective connection point. There is, for example, at least one connection point which does not have any region, in which the respective connection point and the associated contact point lie one above the other in the vertical direction.

According to at least one embodiment of the optoelectronic semiconductor chip, a plurality of second contact points are electrically conductively connected to a common second connection point. For example, the rewiring structure electrically conductively connects a plurality of second contact points to one and to a common second connection point. Alternatively, the second common connection point is designed in such a way that it electrically conductively connects a plurality of second contact points to one another, wherein the rewirings of second type are in direct contact only with a second contact point. In particular, it is possible for all the second contact points to be electrically conductively connected to a common second connection point.

According to at least one embodiment, each first connection point is arranged laterally directly adjacent to a further first connection point. Laterally directly adjacent, in this context, means that the first connection point and the further first connection point are arranged in the lateral direction, parallel to the main extension plane of the optoelectronic semiconductor chip, next to each other at a distance from each other. No further connection point is arranged between two connection points which are directly adjacent to one another. This means, for example, that exclusively electrically insulating material is arranged between the first connection point and the laterally directly adjacent first connection point.

According to at least one embodiment of the optoelectronic semiconductor chip, the optoelectronic semiconductor chip comprises a semiconductor body, first and second contact points, a rewiring structure and first and second connection points. The semiconductor body has a plurality of emission regions, which are arranged laterally next to one another and which can each be electrically conductively contacted via the first and second contact points and can be operated separately from one another. The rewiring structure electrically conductively connects each first contact point to a first connection point. Furthermore, the rewiring structure electrically conductively connects each second contact point to a second connection point. At least one of the connection points does not overlap in the vertical direction with an electrically conductively connected contact point. A plurality of second contact points are electrically conductively connected to a common second connection point. Each first connection point is arranged laterally directly adjacent to a further first connection point.

An optoelectronic semiconductor chip described here is based, among other things, on the following considerations. Optoelectronic semiconductor chips which comprise a multiplicity of emission regions, can each have a first and a second contact point per emission region. The first and the second contact points can be arranged on a common surface of the optoelectronic semiconductor chip. The first contact points of each emission region are then arranged next to one another in the lateral direction, for example, along a regular grid. The first contact points are each electrically conductively connected to first connection points and the second contact points are each electrically conductively connected to second connection points. The second connection points can be arranged with a concentric lateral spacing, in each case surrounding each first connection point in the lateral direction. In the case of this geometry of the connection points, these are limiting for the miniaturization of the optoelectronic semiconductor chip, since in this case a first insulating region, a second connecting point and a further insulating region are arranged between two first connecting points. The minimum dimensions of the connection points and of the insulating regions, which are caused, for example, by the production method, are limited for the miniaturization of the emission regions of the optoelectronic semiconductor chip.

The optoelectronic semiconductor chip described here makes use, inter alia, of the idea of using a rewiring structure, so that the geometry of the contact points does not further limit the miniaturization of the optoelectronic semiconductor chip, which has a multiplicity of emission regions. By means of the rewiring structure, the local assignment of emission region and associated connection point, by which the emission region is contacted and operated, is eliminated. For this purpose, the contact points are electrically conductively connected to the associated connection points via the rewiring structure. Since the rewiring structure can be produced on the semiconductor body using a lithography method, the lateral dimensions of the contact structures are limited by the resolution limit of the lithography method with which the rewiring structure is produced. However, the geometry of the connection points can be optimized with regard to the soldering process for electrically contacting the optoelectronic semiconductor chip.

Advantageously, the rewiring structure enables to select the shape and arrangement of the connection points via which the optoelectronic semiconductor chip is electrically conductively contacted by means of a soldering process, independent of the shape and arrangement of the contact points via which the emission areas of the optoelectronic semiconductor chip are separately contacted. For example, the distance between similar contact points can be larger than the distance between similar contact points. Thus, the emission ranges of the optoelectronic semiconductor chip can be miniaturized without the contact points limiting this miniaturization.

According to at least one embodiment of the optoelectronic semiconductor chip, the rewiring structure is monolithically integrated into the optoelectronic semiconductor chip. For example, the wiring structure using a lithographic process on the semiconductor body is produced. Advantageously enables the monolithic integration of the rewiring structure in the optoelectronic semiconductor chip particularly small contact points for contacting, since the structures produced by the lithography method can be significantly smaller than the structures, which can be contacted by means of a soldering method.

According to at least one embodiment, at least one of the connection points does not overlap with one emission region that is uniquely associated to this connection point in vertical direction. In particular, the connection points and the uniquely associated emission region are electrically conductively connected to each other. In this context, non-overlapping arrangement means that the connecting point cannot be projected vertically onto the emission region electrically conductively connected to the respective connection point. It exists, for example, at least one connection point which has no region, in which the respective connecting point and the associated emission region lie one above the other in vertical direction. Advantageously, a free arrangement of the connection points, which are arranged overlapping with the emission ranges, allows a simplified electrical contacting of the connection points.

According to at least one embodiment of the optoelectronic semiconductor chip, the rewiring structure has a second rewiring via which all second contact points are electrically conductively connected to each other. Advantageously, the rewiring structure connects all second contact points with a common second connection point, which reduces the space required for the connection points, in particular the second connection points.

According to at least one other embodiment of the optoelectronic semiconductor chip, the second rewiring in lateral directions is designed multiply continuously. For example, the second rewiring has cut-outs. For example, material from the first rewiring can be arranged in the cut-outs. The second rewiring can, for example, be completely penetrated by the first rewiring in places transverse to the main extension plane of the semiconductor body in the area of the cut-outs. The first rewiring is the part of the rewiring structure that electrically conductively connects the first contact points with the first connection points.

According to at least one embodiment of the optoelectronic semiconductor chip, the second connection point is designed simply continuously. The second connection point therefore does not have a cut-out in which insulating material or material of a first connection point is arranged. Advantageously, the space requirement for the second connection point is minimized if it is designed simply continuously.

According to at least one embodiment of the optoelectronic semiconductor chip, the second connection point, to which a plurality of emission regions are electrically conductively connected, covers more than 30%, in particular more than 50%, of the surface of the rewiring structure facing away from the emission regions. Advantageously, a large area allocation of the optoelectronic semiconductor chip by the second connection point enables a particularly reliable electrically conductive contacting of the optoelectronic semiconductor chip and an improved removal of heat, which is generated during operation of the optoelectronic semiconductor chip.

According to at least one embodiment of the optoelectronic semiconductor chip, the first and second connection point cover more than 70% of the surface of the rewiring structure facing away from the emission regions. In particular, the first and second connection points cover more than 80%, preferably more than 90%, of the surface of the rewiring structure facing away from the emission areas. Advantageously, a large area allocation of the optoelectronic semiconductor chip by the second connection point enables a particularly reliable electrically conductive contacting of the optoelectronic semiconductor chip and an improved removal of heat, which is generated during operation of the optoelectronic semiconductor chip.

According to at least one embodiment of the optoelectronic semiconductor chip, the area of at least one first contact point is smaller than the area of the electrically conductively connected first connection point. In particular, the area of each first contact point is smaller than the area of each electrically connected first connection point. Advantageously, the larger area of the connection points enables particularly simplified electrical contacting of the optoelectronic semiconductor chip, for example, by means of a soldering process. In addition, the rewiring structure enables particularly small contact points, so that the size of the contact points does not limit the miniaturization of the emission regions of the optoelectronic semiconductor chip.

In addition, a method for producing an optoelectronic semiconductor chip is given. In particular, the method can be used to produce an optoelectronic semiconductor chip described here. This means that all features disclosed for the optoelectronic semiconductor chip are also disclosed for the method and vice versa.

According to at least one embodiment of the method for producing an optoelectronic semiconductor chip, a semiconductor body is first provided. For example, the semiconductor body is formed from a semiconductor compound material and comprises, for example, a semiconductor of first type, a semiconductor of second type and an active region located between the semiconductor of first type and the semiconductor of second type. For example, the semiconductor of first type may be a p-type semiconductor. For example, the semiconductor of second type may be an n-type semiconductor. The active region is designed to generate electromagnetic radiation during operation of the optoelectronic semiconductor chip. Alternatively, the semiconductor of first type can be an n-type semiconductor and the semiconductor of second type a p-type semiconductor.

The semiconductor body further comprises exposed first contact points and exposed second contact points arranged on a main surface of the semiconductor body. For example, the semiconductor of the first type can be electrically contacted and supplied with current via the first contact points and the semiconductor of the second type via the second contact points. In particular, the first and second contact points are arranged on a common main surface of the semiconductor body.

According to at least one embodiment of the method for producing an optoelectronic semiconductor chip, a rewiring structure is applied to the main surface of the semiconductor body in a further process step, on which the first and second contact points are arranged. The rewiring structure includes, for example, rewirings of first type, rewirings of second type and an insulating material. The rewirings of first and second type are made of an electrically conductive material. The rewirings of first type are each in direct contact with a first contact point and are electrically connected to this contact point. The rewirings of second type are each in direct contact with a second contact point and are electrically conductively connected to this contact point. In particular, a rewiring of second type can be in direct contact with a plurality of contact points, in particular all contact points, and be electrically conductively connected to them. In particular, the rewiring structure is produced on the main surface of the semiconductor body. In this case, the rewiring structure is not arranged as a finished component on the main surface of the semiconductor body, but is created on the main surface of the semiconductor body during the production process. For example, the rewiring of first type and the rewiring of second type are applied by physical vapor deposition (PVD), chemical vapor deposition (CVD), evaporation or sputtering.

According to at least one embodiment of the method for producing an optoelectronic semiconductor chip, first and second connection points are applied to the side of the rewiring structure facing away from the semiconductor body in a further process step. The first and second connection points are made of an electrically conductive material, such as one or more metals. For example, the first and second connection points are applied to the rewiring structure by means of physical vapor deposition (PVD), chemical vapor deposition (CVD), evaporation or sputtering. The first connection points are arranged on the rewiring structure in such a way that they are in direct contact with a rewiring of first type. The second connection points are arranged on the rewiring structure in such a way that they are in direct contact with a rewiring of second type. The rewiring structure is designed in such a way that it electrically conductively connects the first contact points with the first connection points and the second contact points with the second connection. Thus, the optoelectronic semiconductor chip can be electrically contacted and operated via the first and second connection points. In particular, the first and second connection points are exposed to the outside so that they can be electrically contacted, for example, by soldering.

According to at least one embodiment of the method for producing an optoelectronic semiconductor chip, the rewiring structure is formed on the semiconductor body in a further process step. In particular, the rewiring structure is formed using a lithography process that can comprise several lithographic process steps.

For example, an image of a photoresist mask is transferred to a photosensitive photoresist by means of exposure in one process step during the production of the rewiring structure. The exposed areas of the photoresist are then dissolved. Alternatively, the unexposed areas can also be dissolved if the photoresist cures under light. In areas where the photoresist is dissolved and removed, electrically conductive material is then applied, from which the rewiring structures of first type and second type are formed. The electrically conductive material can be applied, for example, by physical vapor deposition (PVD), chemical vapor deposition (CVD), vapor deposition or sputtering. In particular, the electrically conductive material comprises one or more metals, such as aluminum.

In a next step, the remaining photoresist can be removed and the electrically insulating material can be applied. The electrically insulating material is applied in such a way that the rewirings of first and second type are completely surrounded by the electrically insulating material in the lateral plane. For example, the electrically insulating material is applied by printing, dip coating, spinning, CVD, PVD or sputtering. The insulating material includes, for example, ceramic material or polymer material. The production steps mentioned for producing the rewiring structure can be carried out several times in succession. This results in a three-dimensional structure of the rewirings of first and second type in several layers. The advantage of the lithography process is that particularly small structures can be produced which are electrically conductively connected to the contact points.

BRIEF DESCRIPTION OF THE DRAWINGS

Further advantages and advantageous refinements and developments of the optoelectronic semiconductor chip and of the method for producing an optoelectronic semiconductor chip are obtained from the following, in connection with the figures, depicted examples.

It shows:

FIGS. 2A, 2B, 2C and 2D show top views of an optoelectronic semiconductor chip after various process steps to produce an optoelectronic semiconductor chip according to a second example.

Same, similar or seemingly similar elements are provided with the same reference numerals in the figures. The figures and proportions of the elements depicted in the figures are not to be regarded as true to scale. Rather, individual elements may be depicted exaggeratedly large for better representability and/or better comprehensibility.

DETAILED DESCRIPTION OF ILLUSTRATIVE EMBODIMENTS

Figure 1A:
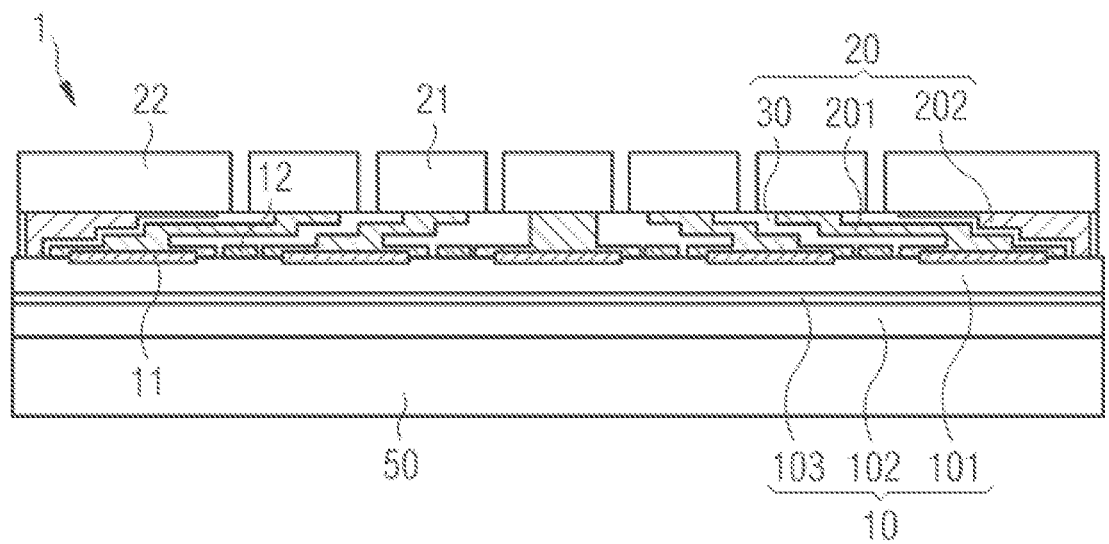
FIGS. 1A and 1B show schematic sectional views of an optoelectronic semiconductor chip according to a first example.

FIG. 1A shows a schematic sectional illustration of an optoelectronic semiconductor chip 1 described here according to a first exemplary embodiment. The optoelectronic semiconductor chip 1 comprises a semiconductor body 10 with a semiconductor of first type 101, a semiconductor of second type 102 and an active region 103 arranged between them. The semiconductor body 10 is arranged on a substrate 50. On the side facing away from the substrate 50 of the semiconductor body 10 first contact points 11 are arranged, via which the semiconductor of first type 101 is electrically contacted. On the same side of the semiconductor body 10 also second contact points 12 are arranged, which are not visible in this sectional view.

Furthermore, the optoelectronic semiconductor chip 1 comprises a rewiring structure 20, which is arranged on the surface of the semiconductor body 10 facing away from the substrate 50 and on the first contact points 11. The rewiring structure 20 comprises electrically insulating material 30, rewirings of first type 201 and rewiring of second type 202. The rewirings of first type 201 are formed of an electrically conductive material and are in direct electrical contact with first contact points 11. Thereby, each first contact point 11 is exactly assigned to one rewiring of first type 201. The electrically insulating material 30 isolates the rewiring structures of first type 201 from each other. Furthermore, the electrically insulating material 30 isolates the rewiring structures of first type 201 from the rewiring structures of second type 202. The rewiring structures of second type 202 completely surround the rewiring structures of first type 201 in lateral directions.

On the side facing away from the semiconductor body 10 of the rewiring structure 20 first 21 and second 22 connection points are arranged. The rewirings of first type 201 each electrically conductively connect exactly one first contact point 11 with exactly one first connection point 21. The rewiring of second type 202 is in direct contact with second contact points 12 and a second connection point 22. The second connection point is designed continuously, in particular multiply continuously.

The connection points are arranged in the lateral plane such that at least two of the first connection points 21 do not overlap with an electrically conductive first contact point 11 in the vertical direction. Furthermore, each first connection point 21 is arranged laterally directly adjacent to a further first connection point 21. In other words, no second connection point 22 is arranged between two first connection points 21. In particular, the area in the lateral plane of each first contact point 11 is smaller than the area of each associated first connection point 21.

The rewiring structure 20 is monolithically integrated into the optoelectronic semiconductor chip 1. In particular, the rewiring structure 20 is produced on the semiconductor body 10 by means of a lithographic production method.

Figure 1B:
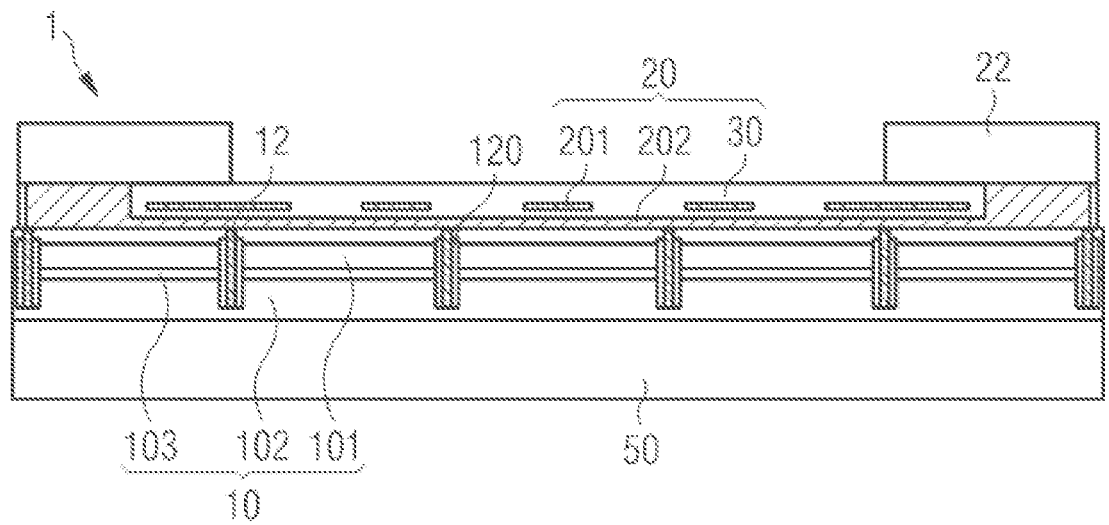

FIG. 1B shows a further sectional view of an optoelectronic semiconductor chip 1 according to the first exemplary embodiment described here. In contrast to FIG. 1A, the optoelectronic semiconductor chip has no first contact points 11 in the region of the sectional view of FIG. 1B. In contrast, the optoelectronic semiconductor chip has second contact points 12 in this area, which are arranged on the side of the semiconductor body 10 facing away from the substrate 50 and are electrically conductively connected to the semiconductor of second type 102. The second contact points 12 completely penetrate the semiconductor of first type 101 and the active region 103, transversely to their main extension plane, in the vertical direction. The second contact points 12 are electrically insulated from the first semiconductor 101 and the active region 103 by means of another electrically insulating material 120.

On the side facing away from the substrate 50 of the semiconductor body 10, the rewiring structure 20 is arranged. The rewiring structure 20 comprises the rewiring of first type 201, the rewiring of second type 202 and the insulating material 30. The rewiring of second type 202 is electrically conductively connected to the second contact points 12. The insulating material 30 insulates rewirings of first type 201 and the rewiring of second type 202 from each other. On the side facing away from the semiconductor body 10 of the rewiring structure 20, a second connection point 22 is arranged. The second connection point 22 is electrically conductively connected to the rewiring of second type 202, so that the semiconductor of second type 102 can be electrically contacted via the second connection point 22 and supplied with current.

FIG. 2A shows a top view of a semiconductor body 10 which is provided in the method for producing an optoelectronic semiconductor chip 1 in a first method step. The semiconductor body 10 has exposed first contact points 11, exposed second contact points 12 and emission areas 15. Each first contact point 11 is arranged in the center of an emission region 15. Thereby, the emission regions in the lateral plane are arranged at the nodal points of a regular grid. In the lateral plane between the emission regions 15 second contact points 12 are arranged.

FIG. 2B shows the top view of the semiconductor body after a next method step, wherein a rewiring structure 20 is applied to the main area of the semiconductor body 10 on which the first 11 and second 12 contact points are arranged. The rewiring structure 20 is produced on the semiconductor body 10 in several lithographic process steps and comprises an insulating material 30, a rewiring of first type 201 and a rewiring of second type 202. The rewiring of first type 201 is arranged on the first contact points 11 and is electrically conductive connected with them. The rewiring of second type 202 is arranged on the second contact points 12 and electrically conductively connected with them. The rewiring of first 201 and second 202 type are formed of an electrically conductive material.

In particular, the rewiring of second type 202 electrically conductively connects all the second contact points 12 to one another. For this purpose, the rewiring of second type 202 has a latticed contour in the lateral plane. The rewiring of the second type 202 can thus be designed multiply continuously.

FIG. 2C shows the top view of the semiconductor body after a next method step, wherein a further part of the rewiring structure 20 is arranged on the already existing part of the rewiring structure 20. In this part of the rewiring structure, no rewiring of second type 202 is arranged between two rewirings of first type 201. Thus, all rewirings of first type 201 are arranged directly adjacent to one another. The rewirings of first type 201 are electrically insulated from one another by the electrically insulating material 30. The rewirings of first type 201 have a line-like structure in the lateral plane. Thereby, the rewirings of first type 201 all extend in the direction of the center of the rewiring structure 20 in the lateral plane. This line-like structure of the rewirings of first type 201 in the lateral plane make it possible to arrange the first connection points 21 laterally offset from the respectively electrically connected contact points 11.

FIG. 2D shows the top view of the semiconductor body 10 after a next method step, wherein first 21 and second 22 connection points being arranged on the side of the rewiring structure 20 facing away from the semiconductor body 10. Thus, it is the top view of a finished optoelectronic semiconductor chip 1. The first connection points 21 and the second connection point 22 are electrically separated from each other by the insulating material 30. The second connection point 22 surrounds the first connection points 21 like a frame.

The first connection points 21 are each electrically connected to exactly one first contact point 11 via a rewiring of first type 201. Each first connection point 21 is associated with exactly one emission region 15 of the optoelectronic semiconductor chip. The emission regions 15 of the optoelectronic semiconductor chip 1 can be operated separately from one another via the first connection points 21. Thereby, at least one first connection point 21 is arranged non-overlapping with the electrically connected first contact point 11. The second connection point 22 is electrically conductively connected to all second contact points 12 via the rewiring of second type 202. The optoelectronic semiconductor chip 1 can be electrically conductively contacted and operated via the first 21 and second 22 connection points. In particular, the area of each first connection point 21 is greater than the area of the electrically conductive first contact point 11.

Figure 3A:
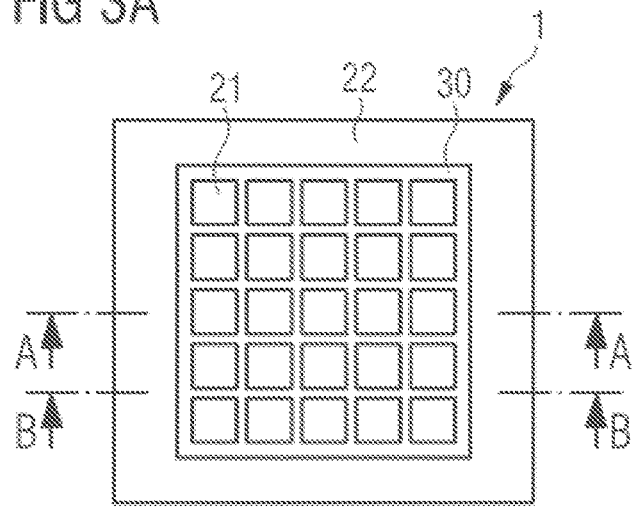
FIGS. 3A, 3B, 3C, 3D, 3E and 3F show the top views of different embodiments of connection points of an optoelectronic semiconductor chip.

FIG. 3A shows a possible embodiment of the first 21 and second 22 connection points according to a first exemplary embodiment. In this case, the second connection point 22 forms a frame in the lateral plane around the first connection points 21, wherein first connection points 21 and the second connection point 22 are electrically insulated from one another by the insulating material 30. The first connection points 21 are displaced in the lateral plane in relation to the assigned first contact points 11 in direction of the center of the optoelectronic semiconductor chip 1. As a result, the first connection points 21 are arranged compressed relative to the first contact points 11. In this embodiment, the first connection points 21 have a rectangular contour, so that the area occupancy is maximized by the connection points. The line AA marks the line along which the sectional view in FIG. 1A runs. The line BB marks the line along which the sectional view in FIG. 1B runs.

Figure 3B:
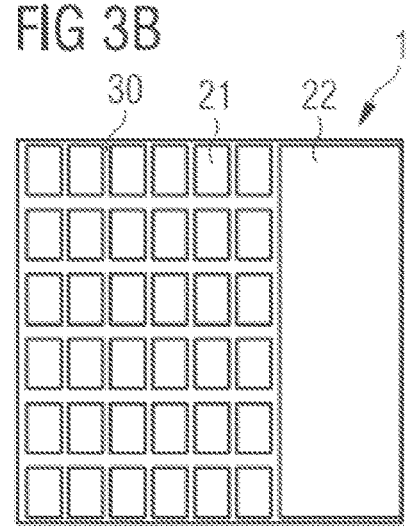

FIG. 3B shows an alternative embodiment of the connection points of an optoelectronic semiconductor chip 1 described here. In contrast to the embodiment shown in FIG. 3A, here the second connection point 22 is designed simply continuous and the connection points are shifted to one side by means of the rewiring structure 20.

Figure 3C:
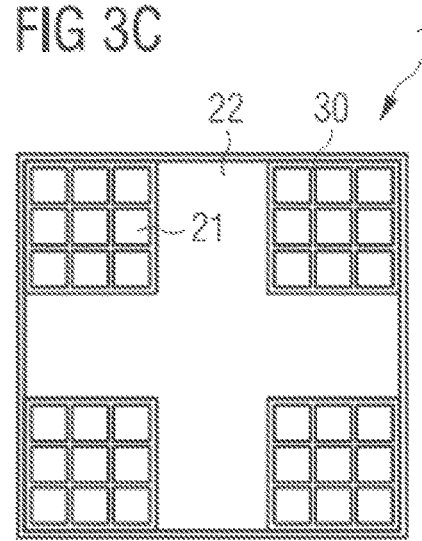

FIG. 3C shows an alternative embodiment of the connection points of an optoelectronic semiconductor chip 1 described here. In this embodiment, the first connection points 21 are subdivided into a plurality of groups. Within these groups, the first connection points 21 are arranged directly adjacent to one another. Between the four groups of connection points, the second connection point 22 is arranged and has a cross-shaped contour. The electrically insulating material 30 insulates the connection points from each other. This embodiment of the connection structures allows any scaling of the number of pixels, so that for a larger number of pixels only further of the connection points shown here are arranged laterally side by side.

Figure 3D:
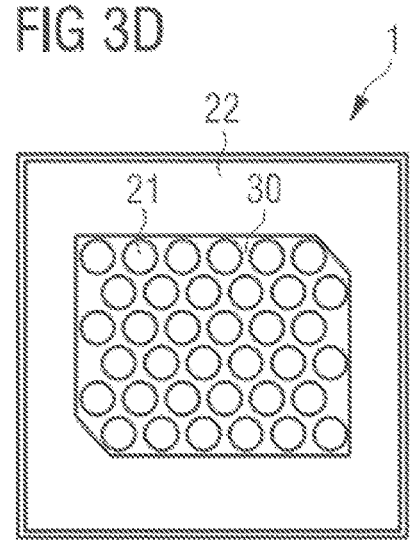

FIG. 3D shows an alternative embodiment of the connection points of an optoelectronic semiconductor chip 1 described here. In this embodiment, the first connection points 21 are of circular design. The second connection point 22 is arranged in the manner of a frame around the first connection points 21 and has two beveled corners in the interior of the frame in order to maximize the area occupancy through the second connection point 22. In particular, the frame-like contour of the second connection points 22 may be different from the frame-like contour of the second contact points 12. For example, the frame-like contour of the second contact points 12 may be square and the frame-like contour of the second connection points 22 hexagonal. For example, the second connection point 22 covers more than 30%, in particular more than 50%, of the surface of the rewiring structure 20 facing away from the emission regions 15.

Figure 3E:
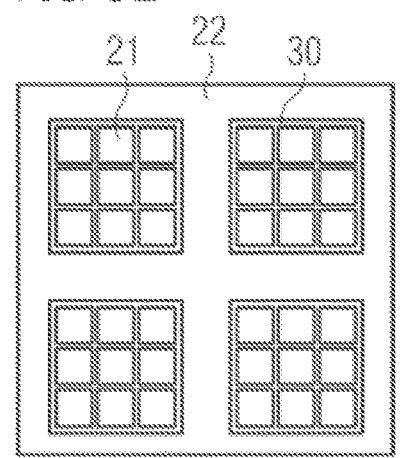

FIG. 3E shows an alternative embodiment of the connection points of an optoelectronic semiconductor chip 1 described here. In this embodiment, the first connection points 21 are subdivided into groups. Within each group, the first connection points 21 are arranged directly adjacent to one another. In lateral directions, the individual groups are each completely surrounded by the second connection point 22. In this case, the second connection point 22 is designed multiply continuously, so that it forms a frame around each group of the first connection points 21. This embodiment of the connection points allows an arbitrary scaling of the number of pixels, so that, for a larger number of pixels, only further of the connection structures shown here are arranged laterally next to one another.

Figure 3F:
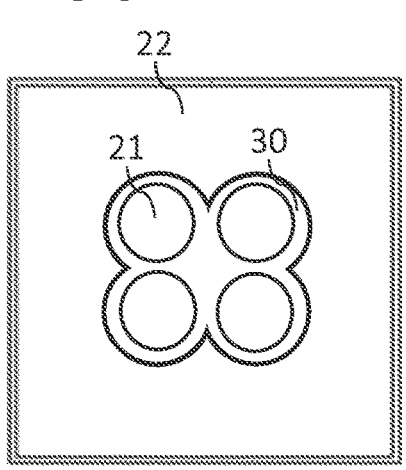

FIG. 3F shows a further exemplary embodiment of the connection points 21, 22 of an optoelectronic semiconductor chip 1 described here. In this embodiment, the second connection point 22 has a cut-out in the form of four circles which partly overlap. In the cut-out four circular first connection points 21 are arranged. In particular, the first connection points 21 are arranged next to one another at the corners of a square in a lateral plane. Thereby, the circular first connection points 21 have a smaller radius than the circular cut-outs in the second connection point 22. In lateral direction between the first and second connection points 21, 22, electrically insulating material 30 is arranged. In particular, in lateral direction, the distance between connection points 21 may be less than the lateral distance between first contact points 11 assigned to the first connection points 21.

The invention is not restricted to the exemplary embodiments by the description on the basis of the exemplary embodiments. Rather, the invention encompasses any novel feature as well as any combination of features, which includes in particular any combination of features in the patent claims, even if this feature or combination itself is not explicitly stated in the patent claims or exemplary embodiments.

The invention claimed is:

1. A method for producing an optoelectronic semiconductor chip wherein the optoelectronic semiconductor chip comprises a semiconductor body having a plurality of emission regions arranged laterally next to one another, a plurality of first and second contact points, a rewiring structure and a plurality of first connection points and at least one second connection point, wherein each emission region is contacted in an electrically conductive manner via a first contact point and a second contact point, wherein the emission regions are configured to be operated separately from one another, wherein the rewiring structure electrically conductively connects each first contact point to an associated first connection point, wherein the rewiring structure electrically conductively connects every second contact point to an associated second connection point, wherein at least one of the connection points does not overlap with a contact point electrically conductively connected to this connection point in a vertical direction, wherein a plurality of second contact points is electrically conductively connected to a common second connection point, wherein each first connection point of the plurality of first connection points is disposed laterally directly adjacent to another first connection point of the plurality of first connection points, wherein the first connection points and the second connection point are configured to be at different electrical potential during operation, wherein the rewiring structure comprises rewirings of a first type, and wherein the rewirings of the first type each electrically conductively connects exactly one first contact point to exactly one first connection point, the method comprising:

providing the semiconductor body, wherein the semiconductor body comprises exposed first contact points and exposed second contact points arranged on a main surface of the semiconductor body, and wherein the individual emission regions of the semiconductor body are produced in a common epitaxy process such that the emission regions are part of a common semiconductor body;

applying the rewiring structure on the main surface of the semiconductor body, on which the first and second contact points are arranged; and applying the first and second connection points on a side of the rewiring structure facing away from the semiconductor body, wherein an area of at least one of the first contact points is smaller than an area of the first connection point.

2. The method according to claim 1, wherein the rewiring structure is formed on the semiconductor body.

3. The method according to claim 1, wherein an area of at least one first contact point is smaller than an area of the first connection points.

* * * * *